(12) United States Patent
Chen (10) Patent No.: US 11,396,392 B2
(45) Date of Patent: Jul. 26, 2022

(54) PARALLEL METHOD FOR PACKAGING ELECTRONIC COMPONENT AND COATING ADHESIVE ON CARRIER TAPE AND MECHANISM FOR SAME

(71) Applicant: Tzu-Chung Chen, Taichung (TW)

(72) Inventor: Tzu-Chung Chen, Taichung (TW)

( * ) Notice: Subject to any disclaimer, the term of this patent is extended or adjusted under 35 U.S.C. 154(b) by 289 days.

(21) Appl. No.: 16/758,011

(22) PCT Filed: Nov. 17, 2017

(86) PCT No.: PCT/CN2017/111523
§ 371 (c)(1),
(2) Date: Apr. 21, 2020

(87) PCT Pub. No.: WO2019/095252
PCT Pub. Date: May 23, 2019

(65) Prior Publication Data
US 2020/0317378 A1 Oct. 8, 2020

(51) Int. Cl.
*B65B 15/04* (2006.01)
*H05K 13/04* (2006.01)
(Continued)

(52) U.S. Cl.
CPC .............. *B65B 15/04* (2013.01); *B29C 65/48* (2013.01); *B29C 66/344* (2013.01); *B29C 66/47* (2013.01);
(Continued)

(58) Field of Classification Search
CPC ........... B65B 15/04; B65B 9/04; B65B 9/045; B29C 65/48; B29C 66/344; B29C 66/47;
(Continued)

(56) References Cited

U.S. PATENT DOCUMENTS

| 4,298,120 A * | 11/1981 | Kaneko | ................ H05K 13/003 |
| | | | 206/460 |
| 2004/0079055 A1* | 4/2004 | Lehner | ................... H05K 13/08 |
| | | | 53/559 |

FOREIGN PATENT DOCUMENTS

| CN | 103213701 A | 7/2013 |
| DE | 19641863 C1 * | 3/1998 ........... H05K 13/003 |

(Continued)

OTHER PUBLICATIONS

Machine English translation of CN103213701, Accessed Mar. 22, 2022 (Year: 2015).*

(Continued)

*Primary Examiner* — Francisco W Tschen
*Assistant Examiner* — Adrianna N Konves
(74) *Attorney, Agent, or Firm* — Guice Patents PLLC (57) ABSTRACT

The present invention provides a parallel method for packaging an electronic component and coating an adhesive on a carrier tape and a mechanism for same, so as to regulate continuous output of an adhesive and intermittent movement in packaging work, so that during a short pause of placing an electronic component, a continuously output adhesive is prevented from being repeatedly applied at a fixed position of a carrier tape. In this way, excessive application of an adhesive can be avoided, and it can be further ensured that the quality of packaging is not affected by an excessive amount of an adhesive.

16 Claims, 8 Drawing Sheets

(51) Int. Cl.
  *B29C 65/48*   (2006.01)
  *B29C 65/00*   (2006.01)
  *B29L 31/34*   (2006.01)
(52) U.S. Cl.
  CPC ....... *B29C 66/849* (2013.01); *H05K 13/0419* (2018.08); *B29L 2031/34* (2013.01)
(58) Field of Classification Search
  CPC .............. B29C 66/849; B29C 66/5326; H05K 13/0419; H05K 13/021; H05K 13/028; B29L 2031/34
  See application file for complete search history.

(56) References Cited

FOREIGN PATENT DOCUMENTS

| | | |
|---|---|---|
| JP | 2003-346114 A | 12/2003 |
| JP | 2007-069946 A | 3/2007 |
| JP | 2011-172666 A | 9/2011 |
| JP | 3186813 U | 10/2013 |
| JP | 2015-233080 A | 12/2015 |
| KR | 20-0439432 | 4/2008 |
| KR | 2008-0088372 | 10/2008 |

OTHER PUBLICATIONS

Machine English translation of DE19641863, Accessed Mar. 22, 2022 (Year: 1998).*

* cited by examiner

PARALLEL METHOD FOR PACKAGING ELECTRONIC COMPONENT AND COATING ADHESIVE ON CARRIER TAPE AND MECHANISM FOR SAME

BACKGROUND OF THE INVENTION

1. Field of the Invention

The present invention relates to electronic component packaging technologies, and in particular, to a parallel method for packaging an electronic component and coating an adhesive on a carrier tape and a mechanism for same.

2. Description of the Related Art

In the prior art of packaging electronic components by using carrier tapes, to resolve inconvenience and energy waste caused when conventionally an adhesive layer is pre-applied on an upper strip, the applicant provides the technical content in Patent No. CN103213701A of delaying the coating of an adhesive layer until packaging work of electronic components is actually being performed. In this case, in the structure of an upper strip, an adhesive layer no longer needs to be coated in advance and a release layer for protection no longer needs to be attached. Therefore, the fabrication cost of an upper strip can be greatly reduced, and substantial economic benefit is obtained.

During specific implementation of the prior-art patent in the industry, a conventional adhesive dispensing technology is used to apply an adhesive agent to a surface of a lower strip, so that the lower strip and an upper strip are joined through bonding. To reduce a control requirement of coating of an adhesive agent, an application method of outputting an adhesive agent on a surface of a lower strip at a fixed flow rate may reduce the control requirement of application. However, in industrial application, such a technology of outputting an adhesive agent at a fixed flow rate fails to satisfy electronic component packaging technologies. Consequently, it is difficult to match the movement for the application of an adhesive agent and packaging work of electronic components.

Specifically, when a carrier tape is used to package electronic components, an electronic component first needs to be placed in a containing chamber of a lower strip. To match the placement of the electronic component, in the prior art, the lower strip moves intermittently, so that during a short pause when the lower strip stops moving, the electronic component is placed in the containing chamber of the lower strip. However, because the foregoing application of an adhesive agent is continuous output of a fixed flow rate, when the lower strip pauses, the adhesive agent is still output continuously to cause excessive local application. As a result, waste occurs, and the quality of packaging is adversely affected.

SUMMARY OF THE INVENTION

Therefore, a main objective of the present invention is to provide a parallel method for packaging an electronic component and coating an adhesive on a carrier tape, so as to regulate continuous output of an adhesive and intermittent movement in packaging work, so that during a short pause of placing an electronic component, a continuously output adhesive is prevented from being repeatedly applied at a fixed position of a carrier tape. In this way, excessive application of an adhesive can be avoided, and it can be further ensured that the quality of packaging is not affected by an excessive amount of an adhesive.

In view of this, to achieve the foregoing objective, the present invention provides a parallel method for packaging an electronic component and coating an adhesive on a carrier tape. A major technical feature of the parallel method is to make a first strip pass through an application unit and a combining unit in different movement states, so that an adhesive is continuously applied on the first strip in the application unit and the first strip and a second strip are combined in an intermittent and stepwise manner in the combining unit.

When the application unit applies an adhesive on the first strip, the first strip continuously passes through the application unit in a first movement. Subsequently, the first strip passes through the combining unit in an intermittent and stepwise manner in a second movement.

Moreover, a speed of the first movement may be greater than a speed of the second movement, so that a to-be-used segment, between the application unit and the combining unit, of the first strip has an increased length and is unfolded under support, to avoid a fold of the to-be-used segment. To prevent the increased length of the to-be-used segment from exceeding a stretchable range, the application unit may implement a plurality of successive application procedures of applying an adhesive, and an interruption time of a pause exists between the successive application procedures.

A continuous movement time of the first movement is the same as an implementation time of the application procedures, and the interruption time is greater than a pause time of an intermittent movement of the second movement, so that an adhesive is applied in a centralized manner, thereby reducing the quantity of the application procedures.

In addition, to prevent the adhesive from overflowing to an undesired location or causing adhesion, an adhesive on the to-be-used segment is dried, and the adhesive may be dried immediately after the application procedure is performed.

Another objective of the present invention is to provide a parallel mechanism for packaging an electronic component and coating an adhesive on a carrier tape, where the parallel method for packaging an electronic component and coating an adhesive on a carrier tape may be implemented on the parallel mechanism.

To achieve this objective, the present invention provides a parallel mechanism for packaging an electronic component and coating an adhesive on a carrier tape, including an application unit, a combining unit, a first strip, and a second strip. The application unit has at least one application end used to output an adhesive. The combining unit and the application unit are separately located at different spatial locations. The first strip is a continuously extending strip body, and passively starts with a first supply end, sequentially passes through the application unit and the combining unit, and ends with a collecting end. When the first strip passes through the application unit, a combining surface on a side of the first strip faces the application end, and the application unit may apply the adhesive on the combining surface by using the application end. When the application unit applies the adhesive on the combining surface, the first strip continuously passes through the application unit in a first movement. When passing through the combining unit, the first strip intermittently passes through the combining unit in a second movement. The second strip is also a continuously extending strip body, and passively starts with a second supply end, passes through the combining unit, and ends with the collecting end. When the second strip passes through the combining unit, a strip surface on a side of the second strip faces the combining surface, so that the adhesive on the combining surface combines the first strip and the second strip.

The first movement and the second movement of the first strip are caused by different powers. That is, a first power portion provides a power to drive the first strip to make the first movement, and a second power portion provides a power to drive the first strip to make the second movement.

The second strip that passes through the combining unit and the first strip that passes through the combining unit in the second movement move synchronously. For ease of achieving synchronous movement, the second power portion drives the first strip and the second strip at the same time.

To provide support to a to-be-used segment, between the application unit and the combining unit, of the first strip and prevent the to-be-used segment from freely drooping to affect use, a stretching portion is held against the to-be-used segment, to make the first strip be supported and unfolded.

When a speed of the first movement is greater than a speed of the second movement, the to-be-used segment has an increased length. In accordance with such an increased length, the stretching portion is movable and moves in accordance with the increased length of the to-be-used segment, to ensure the support provided to the first strip.

To simplify the mechanism, the first power portion may drive the first strip via the movable stretching portion to make the first movement.

The first power portion is a fluid pressure cylinder piece that uses fluid pressure as a power source, and the stretching portion is disposed on a force output shaft of the first power portion. When the force output shaft of the first power portion extends outwardly, the force output shaft drives the first strip to make the first movement and at the same time makes the stretching portion displace, to keep the stretching portion held against the to-be-used segment. When the force output shaft of the first power portion actively or passively retracts inwardly, the force output shaft makes the first strip stop the first movement but still maintains the second movement, so that the length of the to-be-used segment decreased. Meanwhile, the retraction of the force output shaft of the first power portion is synchronous with the second movement, to maintain the support of the stretching portion for the to-be-used segment with the decreasing length.

DETAILED DESCRIPTION OF THE PREFERRED EMBODIMENTS

Figure 1:
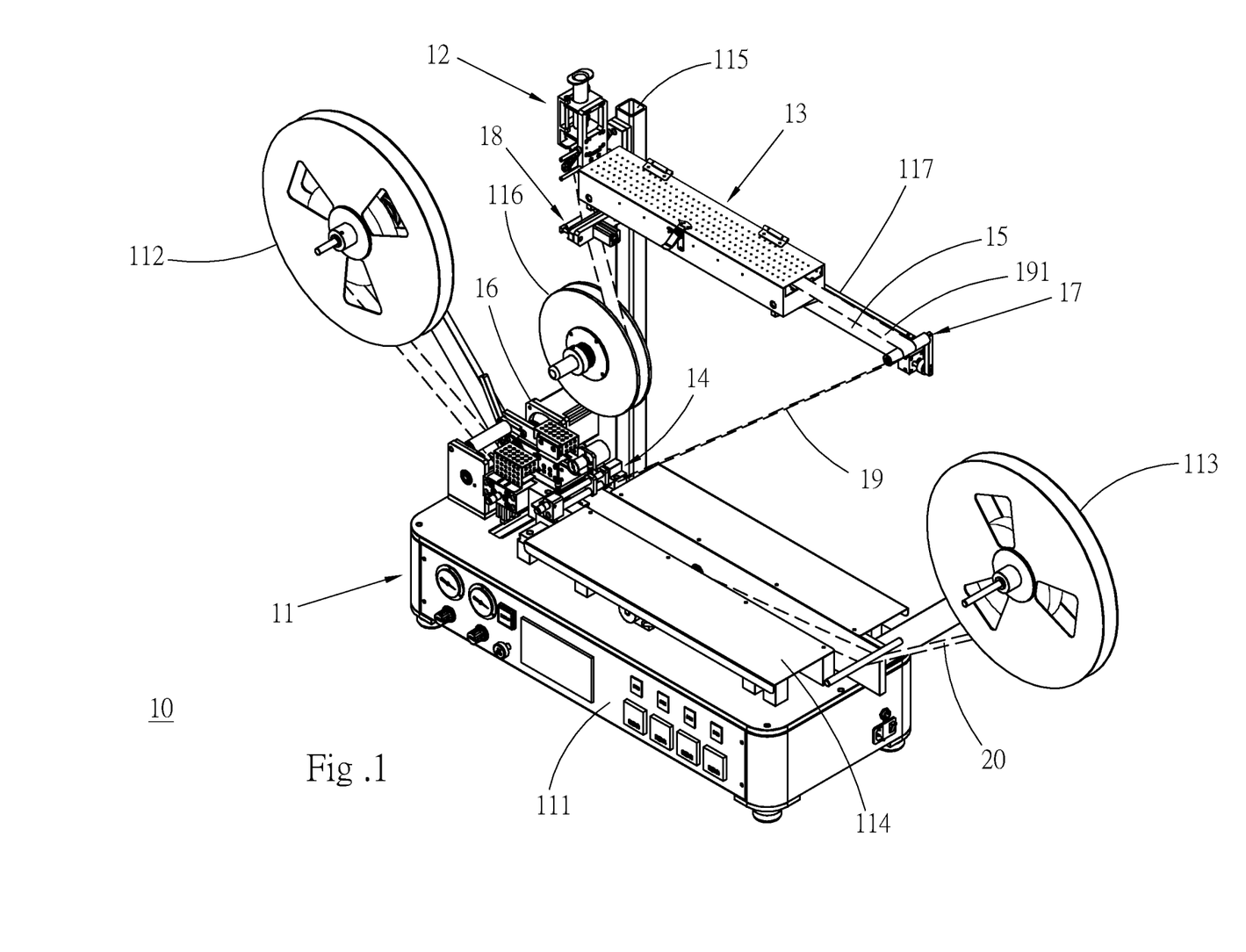
FIG. 1 is a three-dimensional view of a viewing angle according to a preferred embodiment of the present invention.
Figure 2:
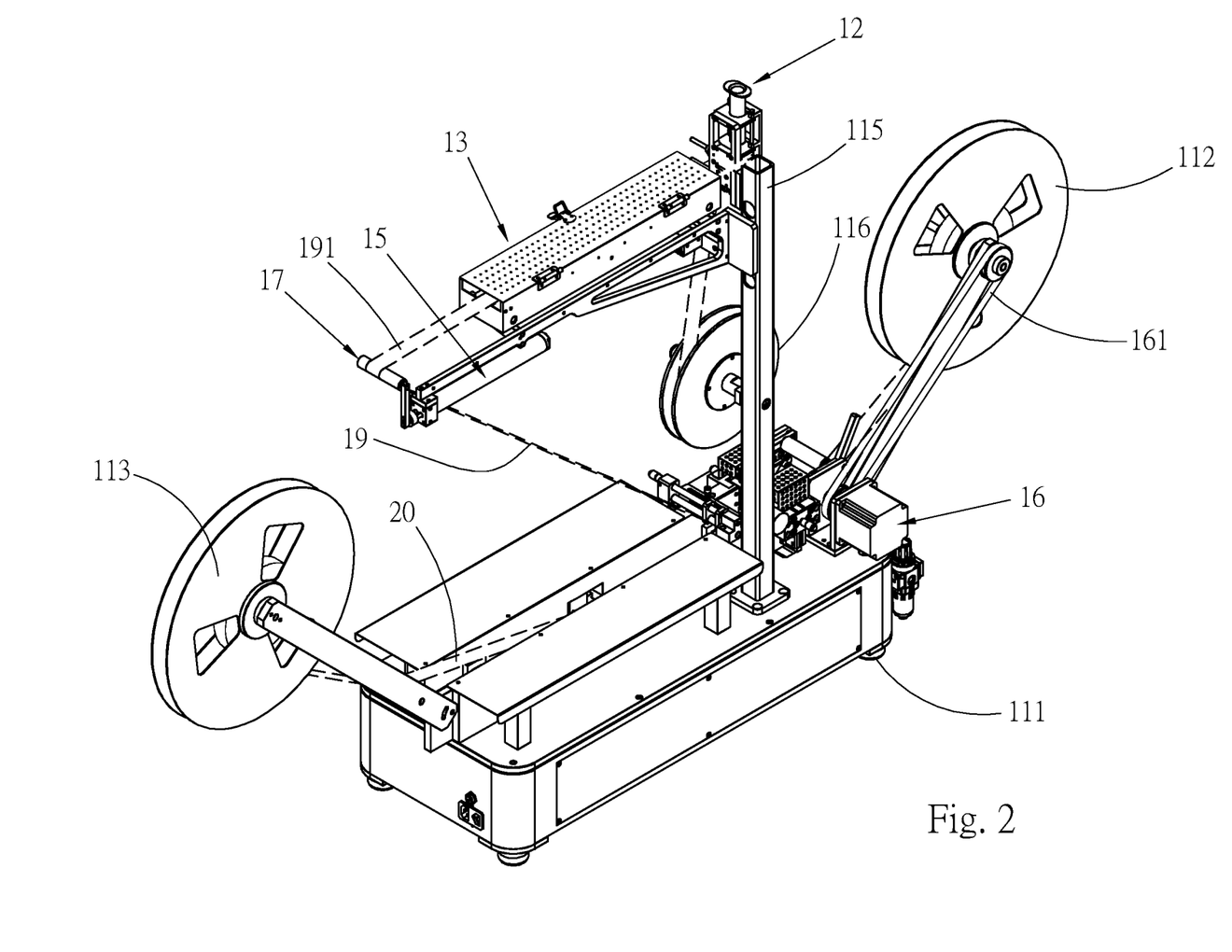
FIG. 2 is a three-dimensional view of another viewing angle according to a preferred embodiment of the present invention.
Figure 3:
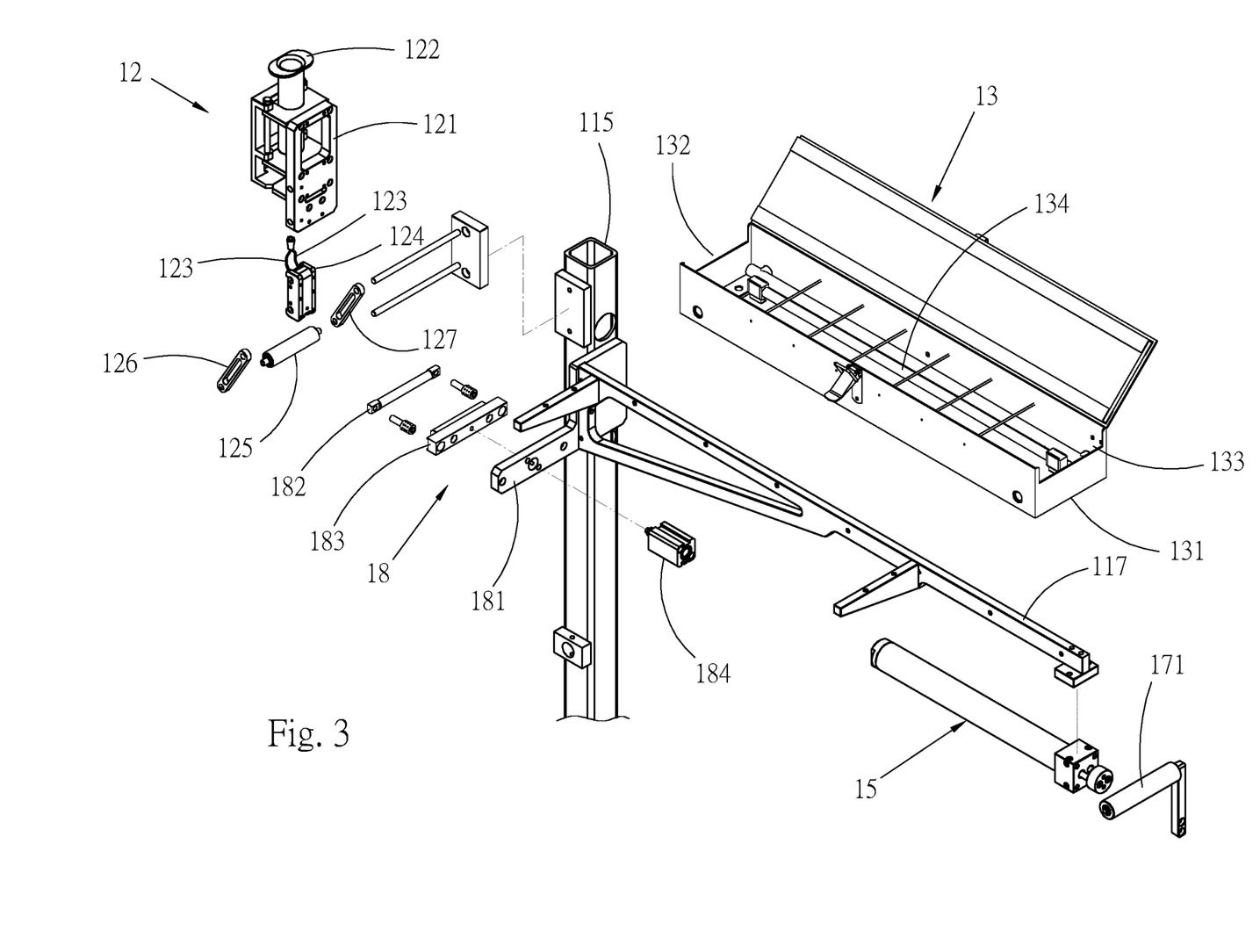
FIG. 3 is a partial exploded view according to a preferred embodiment of the present invention.

First, referring to FIG. 1 to FIG. 3, a parallel mechanism (10) for packaging an electronic component and coating an adhesive on a carrier tape provided in a preferred embodiment of the present invention mainly includes a seat (11), an application unit (12), a drying portion (13), a combining unit (14), a first power port ion (15), a second power portion (16), a stretching portion (17), a braking portion (18), a first strip (19), and a second strip (20).

The seat (11) has a generally rectangular base (111). A first roller (112) and a second roller (113) are respectively disposed protruding on two ends of a long axis of the base (111) through an arm. An electronic component placement and processing area (114) is located on an upper-side base surface of the base (111) and between the first roller (112) and the second roller (113). An upright (115) is vertically disposed on the base (111). A third roller (116) is pivoted on a middle portion of the upright (115). A cantilever (117) transversely extends from an upper portion of the upright (115) to a side.

Figure 4:
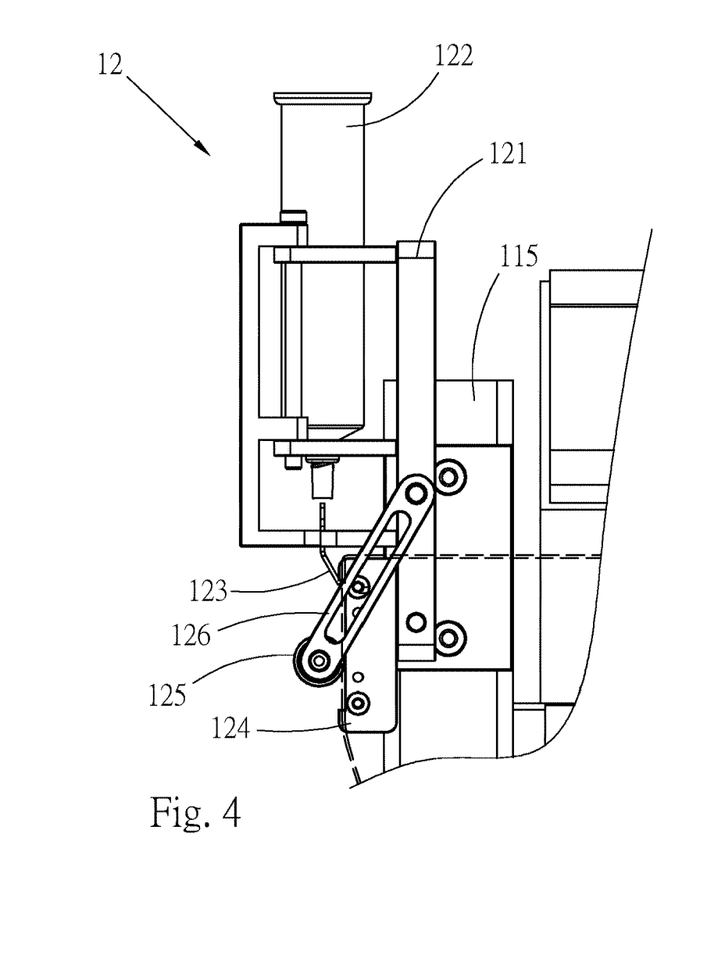
FIG. 4 is a partial planar view according to a preferred embodiment of the present invention, showing that a first strip passes through an application unit.

Referring to FIG. 4 together, the application unit (12) has a support (121) fixed at a top end of the upright (115). A large-tube-shaped container (122) is inserted in the support (121). Two small-tube-shaped application ends (123) are connected to the container (122) and symmetrically extend downwardly from a bottom end of the container (122). A positioning block (124) is fixed on the upright (115), and a side of positioning block (124) faces and is adjacent to tube openings of the application ends (123). A pressure wheel (125) is pivotally connected on the support (121) through two swing arms (126) (127), so as to be attached on the positioning block (124) through a wheel surface, and is located below the application ends (123).

The drying portion (13) has a rectangular box body (131), and is fixed on the cantilever (117). An inlet (132) and an outlet (133) are separately disposed on two ends of a long axis of the box body (131), and are used to connect the space inside the box body (131) and outside. A plurality of heat pipes (134) is evenly disposed on a bottom portion inside the box body (131), and is located below a horizontal plane on which the inlet (132) and the outlet (133) are located. In this way, thermal energy of the heat pipes (134) may be used to heat air to produce thermal convection, or an external air-flow generation apparatus is added to accelerate the convection of air, or a liquid solvent in an adhesive is oscillated by using a microwave to rapidly increase energy of solvent molecules, so as to increase a speed at which the liquid solvent disperses in a gaseous state.

Figure 5:
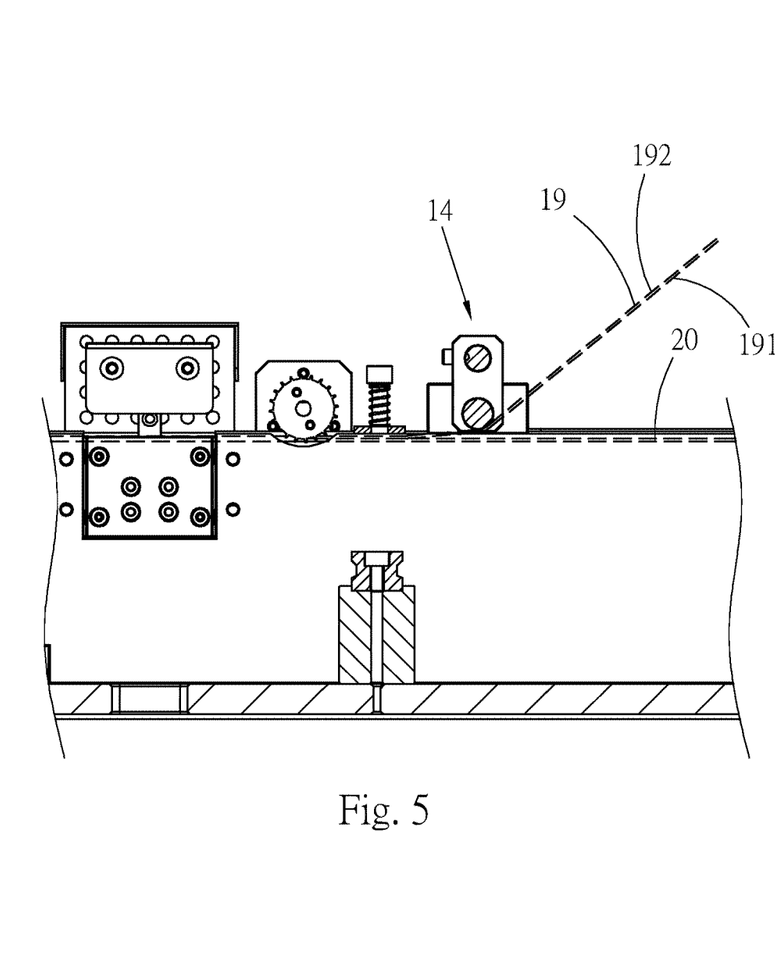
FIG. 5 is a partial planar view according to a preferred embodiment of the present invention, showing that a first strip and a second strip pass through a combining unit.

Referring to FIG. 5 together, the combining unit (14) is disposed on the base (111) and between the electronic component placement and processing area (114) and the first roller (112).

The first power portion (15) is a fluid pressure cylinder piece that uses fluid pressure as a power source, and is fixed on the cantilever (117).

A conventional driving technology such as a motor is used for the second power portion (16). A driving manner in which the second power portion (16) is applied to electronic component packaging technologies also falls within the scope of the prior art. Therefore, the detailed technical content of the second power portion (16) is not described herein.

Figure 6:
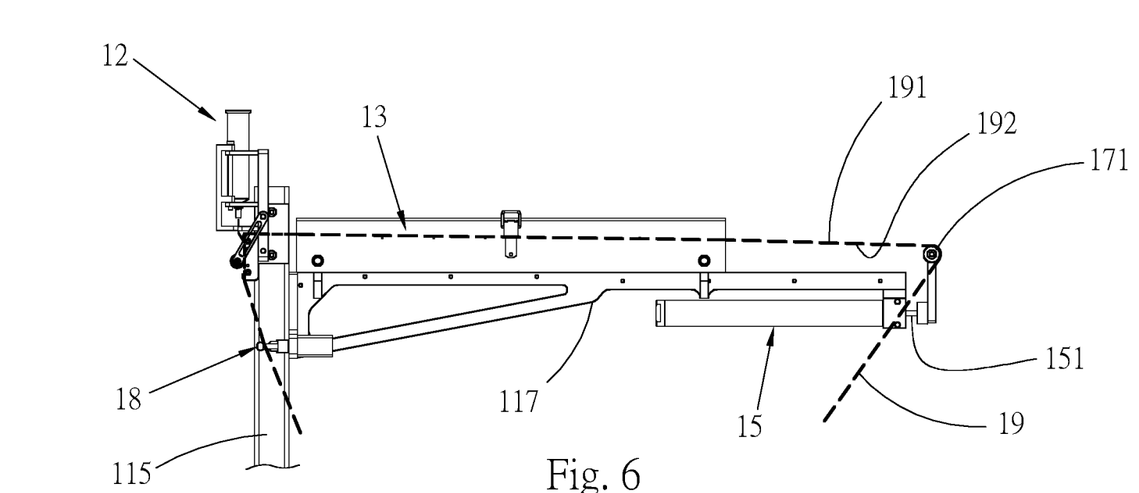
FIG. 6 is a partial planar view according to a preferred embodiment of the present invention, showing that a first strip is supported by a stretching portion.

Referring to FIG. 6 together, the stretching portion (17) has a roller column (171) that is rotatably disposed at an end of a force output shaft (151) of the first power portion (15) and may reciprocally and linearly displace as the force output shaft (151) of the first power portion (15) extends and retracts.

Figure 8:
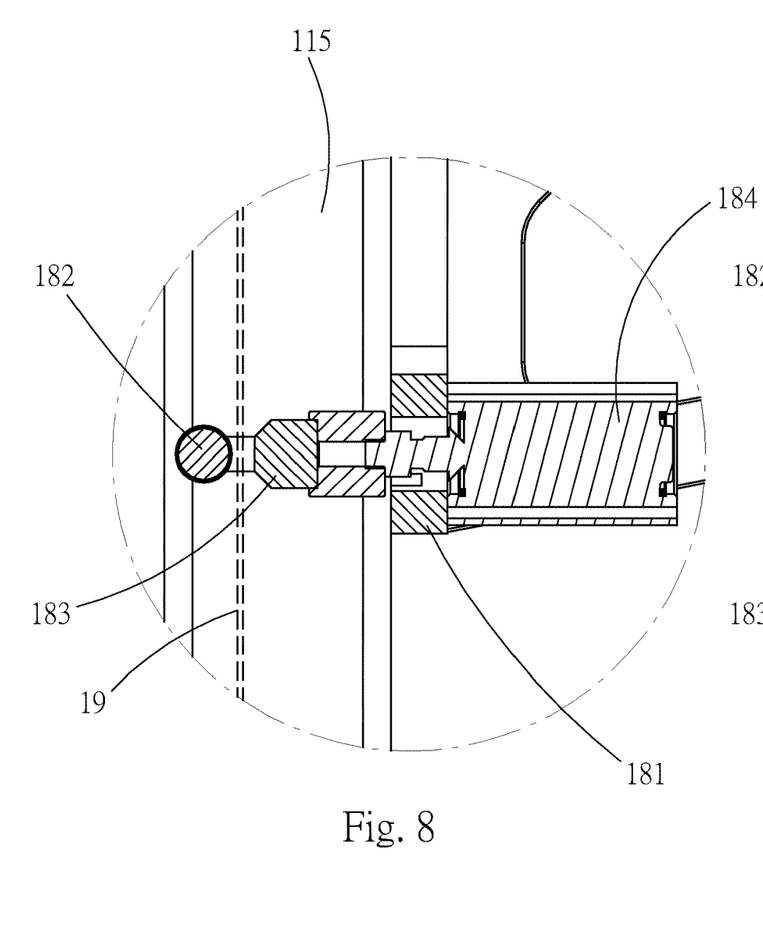
FIG. 8 is a partial planar view according to a preferred embodiment of the present invention, showing a state in which a first strip is not braked by a braking portion.

Referring to FIG. 8 together, the braking portion (18) is located between the application unit (12) and the third roller (116), and has a carrier plate (181) fixed on the upright (115), a columnar fixed side (182) having two ends suspended on the carrier plate (181), a block-shaped movable side (183) located between the fixed side (182) and the carrier plate (181) and slidably disposed on the carrier plate (181) opposite the fixed side (182), and a braking fluid pressure cylinder (184) that is fixed on the carrier plate (181) and may provide a power to drive the movable side (183) to reciprocally and linearly displace towards or away from the fixed side (182).

The first strip (19) and the second strip (20) are components of a conventional carrier tape. A plurality of containing chambers (not shown) provided on the second strip (20) accommodates an electronic component. The first strip (19) is attached and bonded on the second strip (20) to close openings of the containing chambers, so as to achieve an objective of packaging the electronic component. The first strip (19) is disposed on the third roller (116) in the form of a rolled strip. The third roller (116) is used as a first supply end. The first strip (19) sequentially passes through the braking portion (18), the application unit (12), the drying portion (13), the stretching portion (17), and the combining unit (14). The first roller (112) is then used as a collecting end to roll the first strip (19). The second strip (20) is also disposed on the second roller (113) in the form of a rolled strip. The second roller (113) is used as a second supply end. The second strip (20) sequentially passes through the electronic component placement and processing area (114) and the combining unit (14). The first roller (112) is also used as the collecting end to roll the second strip (20).

By means of the foregoing members, during the use of the parallel mechanism (10) for packaging an electronic component and coating an adhesive on a carrier tape, the second power portion (16) performs transmission via a belt (161) to drive the first roller (112) to make an intermittent rotation, so that at the same time when the second strip (20) is being rolled, the rolled first strip (19) synchronously passes through the combining unit (14) intermittently in a second movement, so as to displace intermittently. In this way, when the second strip (20) passes through the electronic component placement and processing area (114), it is easy to place an electronic component an unoccupied containing chamber. Subsequently, in the combining unit (14), the combining unit (14) then seals the first strip (19) on the second strip (20) by using a conventional combining procedure.

For an adhesive used to combine the first strip (19) and the second strip (20), the application unit (12) coats and applies the adhesive on a combining surface (191) on a side of a strip body of the first strip (19) by using a conventional application procedure. Specifically, when passing through the application unit (12), the first strip (19) is located between the positioning block (124) and the application ends (123), and the combining surface (191) slides and is held against the tube openings of the application ends (123). In this way, the adhesive stored in the container (122) is coated and applied on the continuously passing combining surface (191) via the application ends (123). After the application, the first strip (19) immediately passes through the drying portion (13) for drying. A degree of drying the adhesive is reached provided that the adhesive is prevented from flowing, and may still be varied in accordance with requirements of different adhesives by making the first strip (19) pass through the drying portion (13) at a fixed speed or increasing a time for which the drying portion (13). Subsequently, a support surface (192) on the other side, opposite the combining surface (191), of the first strip (19) is attached on the roller column (171), so that the originally upward combining surface (191) turns to face downwardly. Therefore, in the combining unit (14), the combining surface (191) faces the second strip (20), so that adhesive bonds the first strip (19) and the second strip (20).

Figure 7:
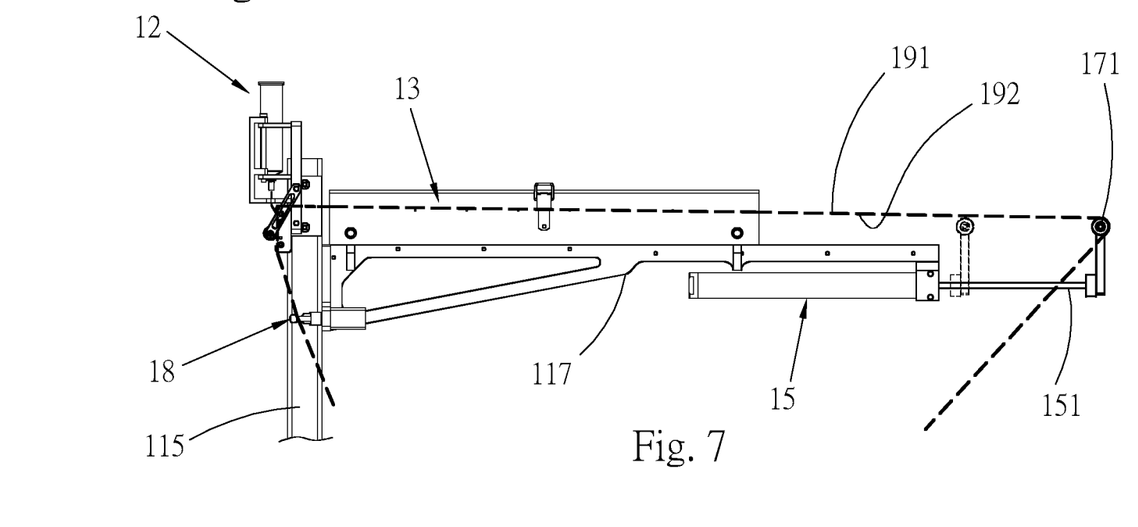
FIG. 7 is a partial planar view according to a preferred embodiment of the present invention, showing a driving state in which a first power portion drives a first strip to make a first movement.

The displacement of the first strip (19) driven by the second power portion (16) is an intermittent movement and therefore fails to match an application state in which the application unit (12) makes the adhesive flow out continuously. Therefore, the first power portion (15) is added. As shown in FIG. 6 and FIG. 7, by means of a power that enables the force output shaft (151) to continuously extend at a stable speed, when the application unit (12) applies an adhesive, the first strip (19) continuously passes through the application unit (12) in a first movement whose speed is greater than a speed of the second movement, so as to avoid that during continuous output of the adhesive, the adhesive is coated unevenly because of a pause caused by the second power portion (16).

However, during an extension travel of the force output shaft (151), the roller column (171) synchronously displaces and is continuously and rollably connected on the support surface (192) of the first strip (19). A force applied by the first power port ion (15) may be transferred to drive the first strip (19) to make the first movement, and a to-be-used segment, between the application unit (12) and the combining unit (14), of the first strip (19) may be stretched, so as to keep the combining surface (191) in an unfolded state, thereby avoiding adhesion due to a fold.

Figure 9:
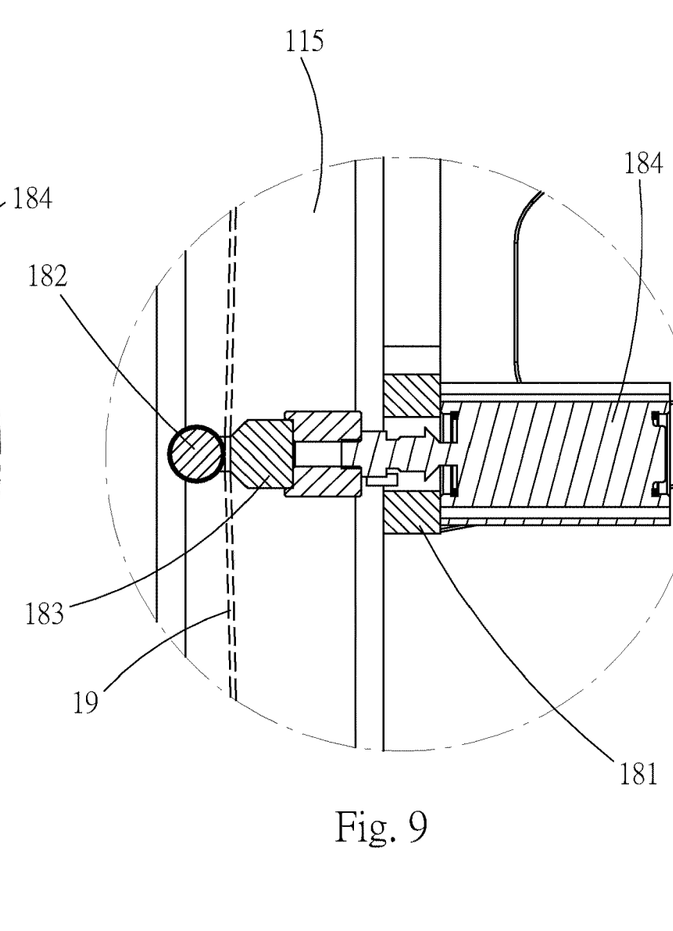
FIG. 9 is a partial planar view according to a preferred embodiment of the present invention, showing a state in which a first strip is braked by a braking portion.
Figure 10:
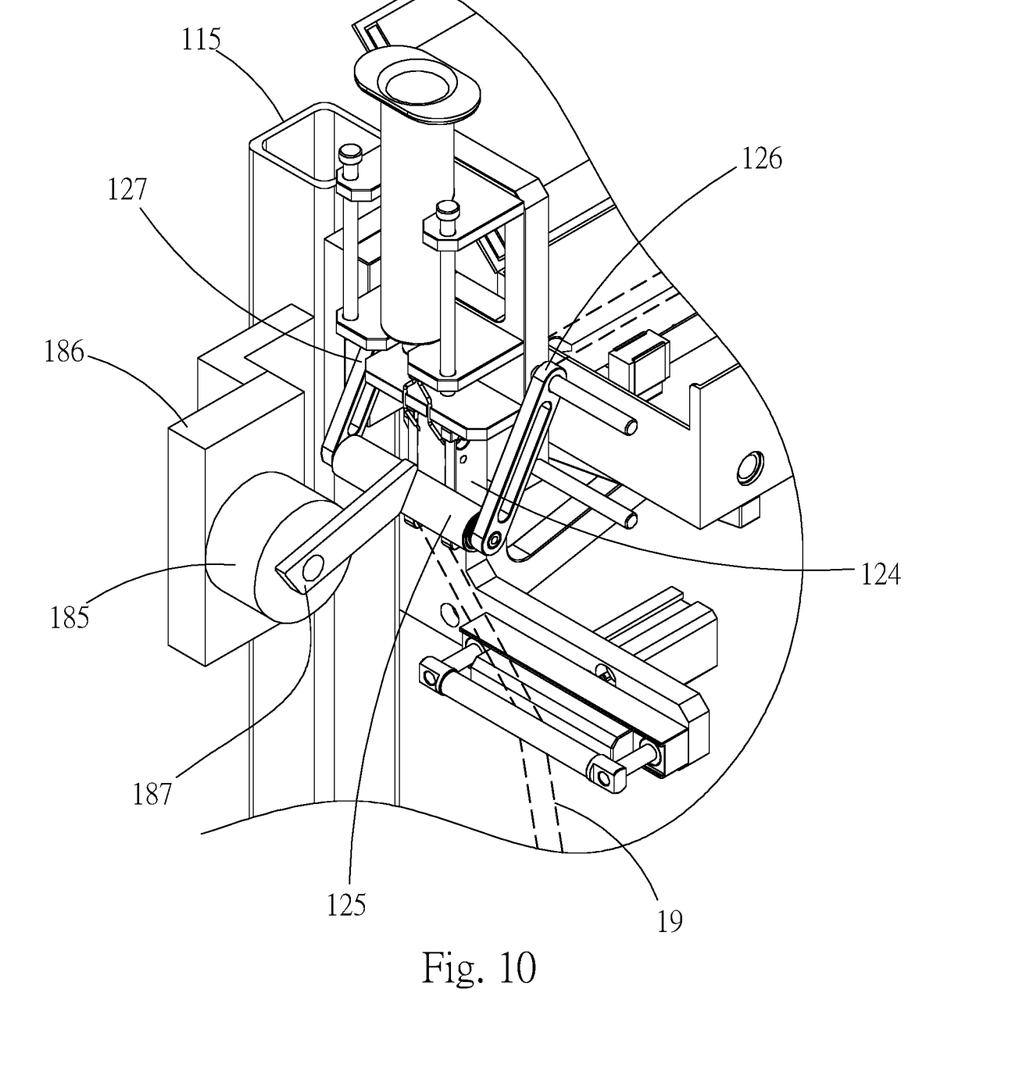
FIG. 10 to FIG. 12 show a state of reinforcing braking of a first strip by a braking portion according to a preferred embodiment of the present invention.
Figure 11:
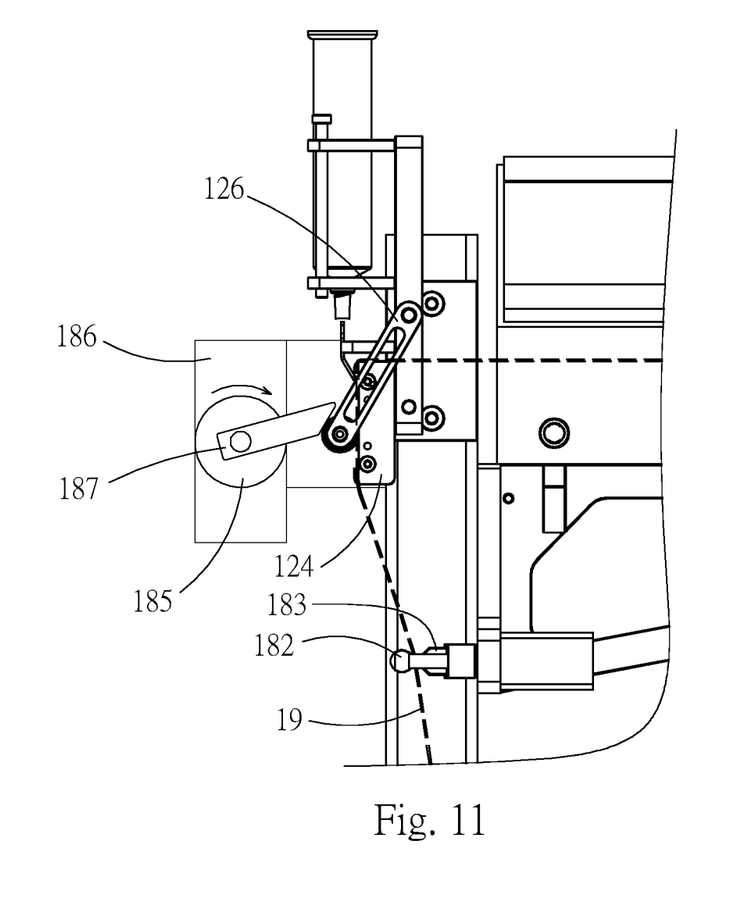
Figure 12:
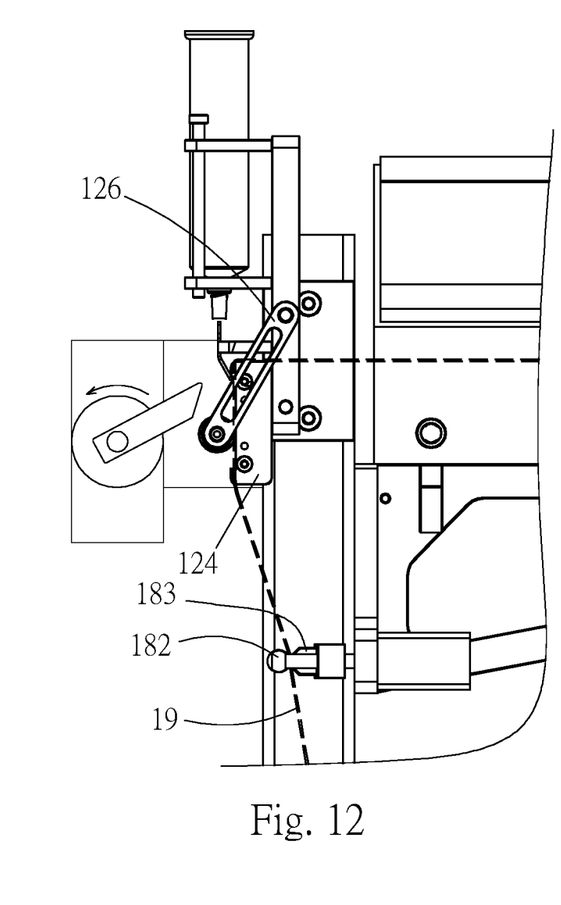

However, because the force output shaft (151) of the first power portion (15) has a limited travel, when the extension travel of the force output shaft (151) is exhausted, as shown in FIG. 8 and FIG. 9, the braking portion (18) holds the first strip (19), so that the first strip (19) can no longer be pulled from the third roller (116), so as to interrupt the first movement, and at the same time temporarily stop the output of the adhesive of the application unit (12) to avoid excessive application of the adhesive. At this time, to ensure that a braking power applied on the first strip (19) is sufficient to fix relative locations of the first strip (19) and the application unit (12) and prevent the first strip (19) from sliding due to continuous pull by the second power portion (16), as shown in FIG. 10 to FIG. 12, the braking portion (18) may further include a rotating body (185) that is pivoted a carrier seat (186) protruding in a lateral direction of the upright (115) and may rotate at the carrier seat (186) when being driven by an external power. An end of a long-plate-shaped press body (187) is fixed on the rotating body (185), and the inclined surface at the other end of the press body (187) faces a wheel surface of the pressure wheel (125). In this way, after the rotating body (185) is driven by an external power to rotate in the direction shown in FIG. 11, the inclined surface at the other end of the press body (187) presses the pressure wheel (125), so that the pressure wheel (125) tightly presses a portion, between the pressure wheel (125) and the positioning block (124), of the first strip (19). In this way, the press body (187) and the movable side (183) brake the first strip (19) together, to ensure that relative locations of the first strip (19) and the application ends (123) do not change. The external power used to drive the rotating body (185) to rotate may be, for example, a power produced as a fluid pressure cylinder disposed on the carrier seat (186) that performs transmission by using a conventional transmission mechanism to drive the rotating body (185) to rotate. A driving technology that is related to the an external power is content in the prior art and therefore is not represented in the drawings.

Subsequently, the to-be-used segment is still continuously rolled in the first roller (112) in response to the operation of the second power portion (16). As a result, the length of the to-be-used segment (193) gradually decreases, and synchronously the force output shaft (151) gradually retracts passively. At the same time, the roller column (171) provides support for unfolding to the to-be-used segment (193), so as to prevent the combining surface (191) from adhesion due to a fold.

Next, when a retraction travel of the force output shaft (151) is exhausted, the extension travel of the force output shaft (151) is started again. The first strip (19) held by the braking portion (18) is released. The output of the adhesive of the application unit (12) is started again, and the first movement of the first strip (19) is made again. Therefore, the application of an adhesive in a next travel is performed.

Therefore, by means of the parallel mechanism (10) for packaging an electronic component and coating an adhesive on a carrier tape, the application of an adhesive may be insusceptible to an intermittent movement. Stable coating at a fixed speed may be maintained in the extension travel of the force output shaft (151) of the first power portion (15). Moreover, a time of the first movement caused based on the extension travel of the force output shaft (151) of the first power portion (15) is greater than a movement time of the second movement. An interruption time caused based on the braking portion (18) and the retraction travel of the force output shaft (151) of the first power portion (15) is also far greater than a pause time of the second movement. Accordingly, the load of repeatedly starting and pausing the application unit (12) within a short time can be avoided, and easy control is achieved. Compared with the prior art, the present invention has significantly enhanced efficacy.

What is claimed is:

1. A parallel mechanism for packaging an electronic component and coating an adhesive on a carrier tape, comprising:
    an application unit, having at least one application end, used to output an adhesive;
    a combining unit, being separate from the application unit;
    a first strip, being a continuously extending strip body, passively starting with a first supply end, sequentially passing through the application unit and the combining unit, and ending with a collecting end, wherein when the first strip passes through the application unit, a combining surface on a side of the first strip faces the application end, so that the application unit may apply the adhesive on the combining surface by using the application end, when the application unit applies the adhesive on the combining surface, the first strip continuously passes through the application unit in a first movement, and when passing through the combining unit, the first strip intermittently passes through the combining unit in a second movement; and
    a second strip, being a continuously extending strip body, and passively starting with a second supply end, passing through the combining unit, and ending with the collecting end, wherein when the second strip passes through the combining unit, a strip surface on a side of the second strip faces the combining surface, so that the adhesive on the combining surface combines the first strip and the second strip.

2. The parallel mechanism for packaging an electronic component and coating an adhesive on a carrier tape according to claim 1, further comprising a first power portion and a second power portion, wherein the first power portion provides a power to drive the first strip to make the first movement, and the second power portion provides a power to drive the first strip to make the second movement.

3. The parallel mechanism for packaging an electronic component and coating an adhesive on a carrier tape according to claim 2, wherein the second strip and the first strip synchronously pass through the combining unit in the second movement.

4. The parallel mechanism for packaging an electronic component and coating an adhesive on a carrier tape according to claim 3, wherein the power provided by the second power portion at the same time drives the second strip to make the second movement.

5. The parallel mechanism for packaging an electronic component and coating an adhesive on a carrier tape according to claim 1, further comprising a stretching portion, held against a to-be-used segment, between the application unit and the combining unit, of the first strip, and being opposite a support surface on another side of the combining surface, to support the first strip.

6. The parallel mechanism for packaging an electronic component and coating an adhesive on a carrier tape according to claim 5, wherein the stretching portion is displaceable.

7. The parallel mechanism for packaging an electronic component and coating an adhesive on a carrier tape according to claim 6, further comprising a first power portion, providing a power and applying the power on the first strip via the stretching portion, to drive the first strip to make the first movement.

8. The parallel mechanism for packaging an electronic component and coating an adhesive on a carrier tape according to claim 2, wherein the first power portion is a fluid pressure cylinder piece.

9. The parallel mechanism for packaging an electronic component and coating an adhesive on a carrier tape according to claim 7, wherein the first power portion is a fluid pressure cylinder piece.

10. The parallel mechanism for packaging an electronic component and coating an adhesive on a carrier tape according to claim 7, wherein the stretching portion has a roller column, indirectly fixed at a force output shaft of the first power portion, and is rollably connected on the support surface of the first strip through a column surface on a circumferential side.

11. The parallel mechanism for packaging an electronic component and coating an adhesive on a carrier tape according to claim 1, further comprising a braking portion, used to stop movement of the first strip between the first supply end and the application unit.

12. The parallel mechanism for packaging an electronic component and coating an adhesive on a carrier tape according to claim 11, wherein when the braking portion stops the movement of the first strip between the first supply end and the application unit, the application unit synchronously stops outputting the adhesive.

13. The parallel mechanism for packaging an electronic component and coating an adhesive on a carrier tape according to claim 11, wherein when a portion, between the first supply end and the application unit, of the first strip is braked by the braking portion, the first strip still continues to pass through the combining unit in the second movement.

14. The parallel mechanism for packaging an electronic component and coating an adhesive on a carrier tape according to claim 13, wherein a speed of the first movement is greater than a speed of the second movement, so that a to-be-used segment, between the application unit and the combining unit, of the first strip has an increased length.

15. The parallel mechanism for packaging an electronic component and coating an adhesive on a carrier tape according to claim 1, further comprising a drying portion, located between the application unit and the combining unit and adjacent to the application unit, and used to dry the adhesive on the first strip.

16. The parallel mechanism for packaging an electronic component and coating an adhesive on a carrier tape according to claim 15, wherein the drying portion uses thermal energy for drying.

* * * * *